(12) United States Patent
Lee et al.

(10) Patent No.: US 9,748,192 B2
(45) Date of Patent: Aug. 29, 2017

(54) PRINTED CIRCUIT BOARD HAVING A POST BUMP

(71) Applicant: LG INNOTEK CO., LTD., Seoul (KR)

(72) Inventors: Ji Haeng Lee, Seoul (KR); Dong Sun Kim, Seoul (KR); Sung Wuk Ryu, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/524,688

(22) Filed: Oct. 27, 2014

(65) Prior Publication Data
US 2015/0115426 A1    Apr. 30, 2015

(30) Foreign Application Priority Data
Oct. 25, 2013    (KR) .................. 10-2013-0127594

(51) Int. Cl.
| H01L 23/02 | (2006.01) |
| H01L 23/48 | (2006.01) |
| H01L 23/52 | (2006.01) |
| H01L 29/40 | (2006.01) |
| H01L 23/495 | (2006.01) |
| H01L 23/00 | (2006.01) |

(Continued)

(52) U.S. Cl.
CPC .......... *H01L 24/16* (2013.01); *H01L 23/4952* (2013.01); *H01L 23/49503* (2013.01); *H01L 23/49811* (2013.01); *H01L 24/11* (2013.01); *H01L 24/81* (2013.01); *H05K 1/09* (2013.01); *H05K 1/111* (2013.01); *H01L 2224/131* (2013.01); *H01L 2224/16059* (2013.01); *H01L 2224/16225* (2013.01); *H01L 2224/16227* (2013.01); *H01L 2224/48091* (2013.01); *H01L 2224/48227* (2013.01); *H01L 2924/12042* (2013.01); *H01L 2924/351* (2013.01)

(58) Field of Classification Search
CPC ......... H01L 23/49503; H01L 23/49811; H01L 24/81; H01L 24/16; H01L 24/11; H01L 23/4952
USPC ................ 257/778, 779, 786, 686, 777, 676
See application file for complete search history.

(56) References Cited

U.S. PATENT DOCUMENTS

| 5,767,580 A | 6/1998 | Rostoker |
| 6,210,173 B1 * | 4/2001 | Matsunaga .......... G01R 1/0483 439/591 |

(Continued)

OTHER PUBLICATIONS

European Search Report dated May 19, 2015 in European Application No. 14190311.2.

*Primary Examiner* — Kimberly Rizkallah
*Assistant Examiner* — Dilinh Nguyen
(74) *Attorney, Agent, or Firm* — Saliwanchik, Lloyd & Eisenschenk

(57) ABSTRACT

Provided are a printed circuit board which can be used as a substrate for a package, a method of manufacturing the printed circuit board, and a semiconductor package using the printed circuit board, the printed circuit board including: a first substrate having a first mounting area for mounting a package substrate and a second mounting area for mounting a semiconductor element; a single layer or multi-layered circuit pattern of the first substrate; and a post bump connected to the circuit pattern, provided on an external insulating layer of the first mounting area, and having a concave upper surface.

10 Claims, 6 Drawing Sheets

(51) Int. Cl.
*H01L 23/498* (2006.01)
*H05K 1/09* (2006.01)
*H05K 1/11* (2006.01)

(56) References Cited

U.S. PATENT DOCUMENTS

| | | | |
|---|---|---|---|
| 2003/0127499 A1 | 7/2003 | Pierson et al. | |
| 2006/0125077 A1* | 6/2006 | Akaike | H01L 22/32 |
| | | | 257/690 |
| 2008/0296765 A1* | 12/2008 | Kurita | H01L 23/481 |
| | | | 257/738 |
| 2013/0134582 A1* | 5/2013 | Yu | H01L 24/13 |
| | | | 257/737 |
| 2013/0193593 A1* | 8/2013 | Lin | H01L 24/13 |
| | | | 257/737 |

* cited by examiner

PRINTED CIRCUIT BOARD HAVING A POST BUMP

CROSS-REFERENCE TO RELATED APPLICATION

This application claims the benefit under 35 U.S.C. §119 Korean Patent Application No. 10-2013-0127594, filed on Oct. 25, 2013, which is hereby incorporated by reference in its entirety.

BACKGROUND

Field of the Invention

Embodiments of the present invention relate to a printed circuit board and a method of manufacturing the same, and more specifically, to a printed circuit board which can be used as a substrate for a package, a method of manufacturing the printed circuit board, and a semiconductor package using the printed circuit board.

Related Arts

A package on package (hereinafter referred to as "POP") is a packaging technology for laminating another package substrate on a printed circuit board or a package substrate. The conventional FC POP (Flip Chip Package on Package) has a form in which a top package for mounting a general memory chip and a bottom package for mounting a processor chip are laminated in a flip chip method. This POP technology is advantageous in that a mounting area can be reduced by forming a processor chip and a memory chip as one package assembly and a high speed signal transmission can be performed by a short path. Thanks to these advantages, the POP technology has been frequently applied to mobile devices.

Also, the FC POP technology may be classified into an SBA (Solder Ball Attach) method using a solder ball for an POP connection and a TMV (Through Mold Via) method to which a laser technology is applied. As various mobile devices have been diversified and miniaturized, a POP pitch has been also reduced to a remarkably minute size. In this trend, the conventional SBA method is disadvantageous in that short defects are high due to the generation of a bridge between solder balls in the fine pitch. Accordingly, since the SBA method has a low yield rate in a process under the condition of about 500 μm or less in a pitch size, it cannot be used in the process. Also, the conventional TMV method is disadvantageous in that it cannot be used in a process under the condition of about 400 μm or less in a pitch size for the same reason.

In addition, in the conventional FC POP technology, a bump solder is used as a package bump for supporting the bottom package and the top package. When this solder bump is used, a size of the solder bump cannot be increased beyond a fixed size due to the occurrence of a solder bridge resulting from a limited chip size. Accordingly, it is disadvantageous in that a degree of freedom in design with a spaced distance between packages required in a semiconductor package is limited.

BRIEF SUMMARY

An aspect of embodiments of the present invention provides a printed circuit board capable of improving a bonding property between the printed circuit board used in an FC POP (Flip Chip Package on Package) and the like and packages substrates connected to an upper of the printed circuit board in a flip chip method, and a method of manufacturing the printed circuit board.

Another aspect of embodiments of the present invention provides a semiconductor package using the printed circuit board and having a flip chip structure with high reliability.

According to an aspect of the present invention, a printed circuit board for a semiconductor package may include: a first substrate having a first mounting area for mounting a package substrate and a second mounting area for mounting a semiconductor element; a single layer or multi-layered circuit pattern of the first substrate; and a post bump connected to the circuit pattern, provided on an external insulating layer of the first mounting area, and having an upper surface with a curvature.

In one embodiment, the upper surface of the post bump may be provided so as to have a concave shape in an inner side of the post bump.

In one embodiment, the concave shape may correspond to an ellipsoidal shape of a lower portion of a solder bump placed on the upper surface of the post bump.

In one embodiment, the printed circuit board may further include a solder resist on an external insulating layer. A part of the solder resist may be partially inserted into a space between an outer circuit layer of the external insulating layer and the post bump.

In one embodiment, the post bump may have a height of 50 to 400 μm, and the concave portion may have a maximum depth of 20 μm.

In one embodiment, a radius of the concave portion may be 20 to 100 μm.

In one embodiment, the concave portion may have a curvature of 1 to 0.01 [μm$^{-1}$].

In one embodiment, a material of the post bump may include Cu, Ag, Au, Al, Cr, Sn, Pb, Ti, W, Ni, V, P or a combination thereof.

In one embodiment, the printed circuit board may further include an underfill for burying the periphery of the post bump.

In one embodiment, the printed circuit board may further include a memory chip or a microprocessor chip connected to the circuit pattern and mounted in the second mounting area in a flip chip type.

According to another aspect of the present invention, a method of manufacturing a printed circuit board for a semiconductor may include: preparing a first substrate having a single layer or multi-layered circuit pattern; and forming a post bump connected to the circuit pattern, provided in a first mounting area of the first substrate for mounting a package substrate, and having a concave upper surface.

In one embodiment, the preparing of the first substrate (step 1) may include: preparing the first substrate provided in a solder resist on an external insulating layer so as to cover an outer circuit layer on the external insulating layer. Also, the forming of the post bump (step 2) may include a process for forming a first opening in the solder resist so as to expose the outer circuit layer; forming an electroless plated layer on the first substrate having the first opening and the solder resist; forming a dry film resist in a first height so as to cover the electroless plated layer; forming a second opening in the dry film resist so as to expose the first opening; filling the second opening and the first opening with a conductive material so that the post bump can be connected to the outer circuit layer and can have a concave upper surface; removing the dry film resist from the electroless plated layer; and removing the electroless plated layer exposed to the solder resist.

In one embodiment, the forming of the first opening may include forming the first opening in a smaller width than a width of the outer circuit layer in one direction so that a part of the solder resist can be partially inserted into a space between a lower end portion of the post bump and the outer circuit layer.

In one embodiment, the manufacturing method of the printed circuit board may further include subjecting the second opening to surface treatment so that surface tension of the conductive material with regard to the second opening can be increased, after the forming of the second opening.

In one embodiment, the performing of the surface treatment of the second opening may be a surface treatment process using an atmospheric plasma treatment method, a vacuum plasma treatment method, a hydrogen peroxide treatment method, a prooxidant treatment method, an anticorrosive agent treatment method or a combination thereof.

In one embodiment, the manufacturing method of the printed circuit board may further include removing smears, burrs, or particles from the solder resist, before the forming of the electroless plated layer.

In one embodiment, the filling of the conductive material may include forming an electroplated layer in which an electroless plated layer is used a seed layer.

In one embodiment, the manufacturing method of the printed circuit board may further include mounting a semiconductor element connected to the circuit pattern in a second mounting area of the first substrate for mounting the semiconductor element in a flip chip type, after the preparing of the first substrate.

According to a further aspect of the present invention, a semiconductor package may include: a printed circuit board of any one of the aforesaid embodiments; a solder bump on a concave portion of an upper surface of a post bump which is disposed on the printed circuit board; and a package substrate on the solder bump.

In one embodiment, the semiconductor package may further include a memory chip or a microprocessor chip mounted on the printed circuit board to be connected to a circuit pattern in an external insulating layer of the printed circuit board.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION

Figure 1:
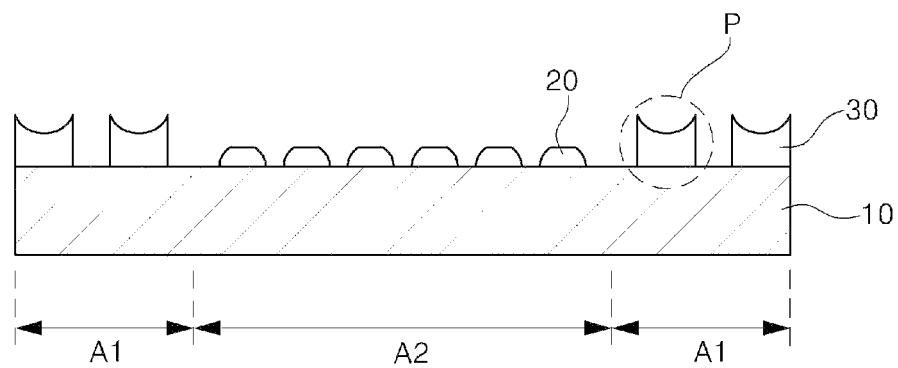
FIG. 1 is a cross-sectional view of a printed circuit board according to one embodiment of the present invention.

Hereinafter, the embodiments of the present invention that an ordinary person skilled in the art can implement will be described with reference to the accompanying drawings. The embodiments in the specification and the constructions shown in the drawings are provided as a preferred embodiment of the present invention, and it should be understood that there may be various equivalents and modifications which could substitute at the time of filing.

In addition, when it comes to the operation principle of the preferred embodiments of the present invention, when the known functions or functions are seemed to make unclear the subject matters of the present invention, they will be omitted from the descriptions of the invention. The terms below are defined in consideration of the functions of the present invention, and the meaning of each term should be interpreted by judging the whole parts of the present specification, and the elements having the similar functions and operations of the drawings are given the same reference numerals.

Terms such as a first term and a second term may be used for explaining various constitutive elements, but the constitutive elements should not be limited to these terms. These terms is used only for the purpose for distinguishing a constitutive element from other constitutive element. In particular, the term 'an upper surface' is intended to refer to one surface of a specific constitutive element, and when viewing a device in a state of being turned or being erect, the upper surface becomes a lower surface, a right side surface or a left side surface. Thus, the term 'upper surface' should not be limited to a meaning of the term itself.

FIG. 1 is a cross-sectional view of a printed circuit board according to one embodiment of the present invention;

Referring to FIG. 1, a printed circuit board according to the present embodiment includes a post bump 30 provided on one surface of a first surface 10 and having a concave upper surface. When a package substrate is mounted to the printed circuit in a flip chip type, the post bump 30 functions as another package bump connected to a solder bump which is a package bump.

The first substrate 10 results from forming a conductive circuit on the surface and in the inside of an electric insulation material and refers to a substrate in a state in which electronic components are not mounted. Here, the electric insulation material may be mentioned as a base substrate and may refer to a single layer or multiple-layered circuit pattern.

When the multiple-layered circuit pattern is provided, the first substrate 10 may have an external insulating layer and an outer circuit layer on the external insulating layer. When the single layer circuit pattern is provided, a base substrate of the first substrate may correspond to the external insulating layer, and the outer circuit layer may correspond to conductive patterns of one surface or both surfaces of the base substrate.

Also, the printed circuit board according to the present embodiment may include another bump 20 according to some embodiments. The other bump 20 may be a solder bump used when mounting a semiconductor element to the printed circuit board in a flip chip type. In this case, the printed circuit board may be a package substrate (hereinafter referred to as 'the first package substrate') and may have a first mounting area A1 for mounting another package substrate (hereinafter referred to as 'the second package substrate') and a second mounting area A2 for mounting the semiconductor element. The semiconductor element may be a memory chip or a micro processor chip.

When an upper surface of the post bump 30 is configured in a concave shape, in a package on package (POP) of a flip chip (FC) structure using a solder bump, the concave upper surface of the post bump 30 is bonded to surround an external surface of one side of the solder bump in an elliptical shape or a globular shape, so that a bonded surface area between the two bumps (the post bump and the solder bump) used as package bumps between the printed circuit board and the package substrate can be increased, and thus a pitch can be reduced in size with securing of a height of the package bump. Moreover, bonding reliability between the printed circuit board and the package substrate can be improved.

Figure 2:
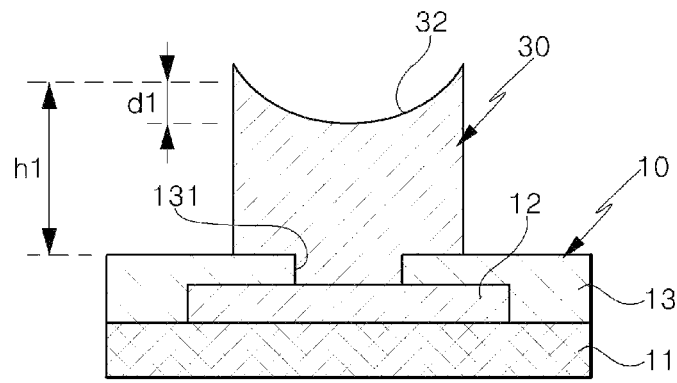
FIG. 2 is an enlarged cross-sectional view of a main part of the printed circuit board of FIG. 1.

FIG. 2 is an enlarged cross-sectional view showing a main part P of the printed circuit board of FIG. 1.

Referring to FIG. 2, the printed circuit board according to the present embodiment may include: an external insulating layer 11 of the first substrate 10; an outer circuit layer 12 on the external insulating layer; a solder resist 13 on the external insulating layer and the outer circuit layer; and a post bump 30 on the outer circuit layer.

An upper surface 32 of the post bump 30 has a concave shape, and a lower surface of the post bump 30 is connected to the outer circuit layer 12 via an opening 131 (hereinafter referred to as 'the first opening') of the solder resist.

A height h1 of the post bump 30 may range from about 50 to 400 μm. This height h1 may be determined according to a minimum distance required between the printed circuit board and the package substrate mounted to the printed circuit board in a flip chip structure in the package on package. This height may be determined according to requirements such as a thickness of the semiconductor element mounted to the printed circuit board or a spaced distance (or an underfill thickness) for appropriate radiant heat.

A concave part of the upper surface 32 has a circular arc form and a maximum depth d1 thereof may be about 20 μm. That is, when a radius R of the concave part is about 20 to 100 μm, a curvature of the concave part may be about 1 to 0.01 [μm$^{-1}$]. The concave part may be easily implemented in a circular arc form (shape on a two-dimensional plane) or a spherical form (shape in a three-dimensional space) having a maximum depth d1 in a central part by subjecting an opening (a second opening) of a dry film resist, which will be described later in the sections regarding a method of manufacturing the printed circuit board, to surface treatment, and thus changing surface tension having a large influence on wettability of a metal material filled in the second opening.

The external insulating layer 11 may be a prepreg (Pre-impregnated Material), which is a sheet type product in which a bonding agent is pre-impregnated in a reinforced fiber. The prepreg is commercialized in a B-state (a soft solid state, which is not completely hardened, as an interim hardening step for a thermosetting synthetic resin) in a manufacturing process of a CCL (Copper Clad Laminate) and is a row material used in the external insulating layer of the printed circuit board mainly beyond four floors. The external insulating layer 11 may contain a resin-based material and glass fiber. The resin-based material refers to epoxy resin, other resin compounds or a combination thereof.

The outer circuit layer 12 is conductive circuits or conductive patterns of an outer side of the first substrate 10. The outer circuit layer 12 may include a first pad of a first mounting area for mounting a package substrate and a second pad of a second mounting area for mounting a semiconductor element. Of course, the outer circuit layer 12 may be arranged in various shapes or forms according to the type or a structure of the printed circuit board.

The outer circuit layer 12 may contain the same material as that of the post bump 30. The same material may be Cu. When Cu is used, the high quality post bump 30 may be easily implemented by forming a copper electroless plated layer on the outer circuit layer 12 and forming a copper electroplated layer based on the copper electroless plated layer as a seed layer. FIG. 2 illustrates the outer circuit layer 12 and the post bump 30 using the same hatching, in light of the fact that they are made of the same material.

Also, according to some embodiments, the outer circuit layer 12 and the post bump 30 may contain different materials. For example, the post bump 30 may contain materials based on one component, two components, three components and the like, such as Sn, SnCu, SnPb, SnAgCu and the like as well as Cu.

In this case, at least the outer circuit layer 12 or the first pad of the circuit patterns of the printed circuit board may be configured by including Ag, Au, Al, Cr, Sn, Pb, Ti, W, Ni, V, P or a combination thereof into Cu. Also, according to some embodiments, at least the outer circuit layer 12 or the first pad of the circuit patterns of the printed circuit board may be configured by including Ag, Au, Al, Cr, Sn, Pb, Ti, W, Ni, V, P or a combination thereof without Cu.

When the outer circuit layer 12 and the post bump 30 contain materials different from each other, the outer circuit layer 12 and the post bump 30 of FIG. 2 may be illustrated using hatching in different shapes.

The solder resist 13 is provided on the external insulating layer 11 to bury the outer circuit layer 12. The solder resist 13 functions to prevent a solder bridge and the like from occurring when a package substrate or a semiconductor element is bonded to the printed circuit board in a flip chip method or a soldering method. Also, the solder resist 13 is formed to substantially entirely cover the printed circuit board except for the first pad or the second pad of the outer circuit layer 12, thereby preventing copper circuit patterns of the outer circuit layer and the like from being easily oxidized in air an d the printed circuit board from being damaged due to an external impact.

A part of the solder resist 13 of the present embodiment is partially inserted between the outer circuit layer 12 and the post bump 30. Here, the lower surface of the post bump 30 limited by the solder resist partially inserted between the outer circuit layer 12 and the post bump 30 may have a bottleneck-like shape in which a width or an area is reduced compared to the other parts of the post bump 30.

In other words, the lower surface in the bottleneck-like shape of the post bump 30 may be bilateral symmetric on a cross section, and according to some embodiments, the lower surface may be bilateral asymmetric. The bilateral asymmetry may refer to a form in which, on the cross section, a part of the solder resist is interposed into merely one side of the left side and the right side from a space between the outer circuit layer 12 and the post bump 30, and in the remaining one side, the solder resist is disposed to be aligned on an extension line of one side of the outer circuit layer 12 or is provided to be in contact with the upper surface and at least one side of the outer circuit pattern layer 12 as well as the external insulating layer 11 through an intended alignment error.

Figure 3:
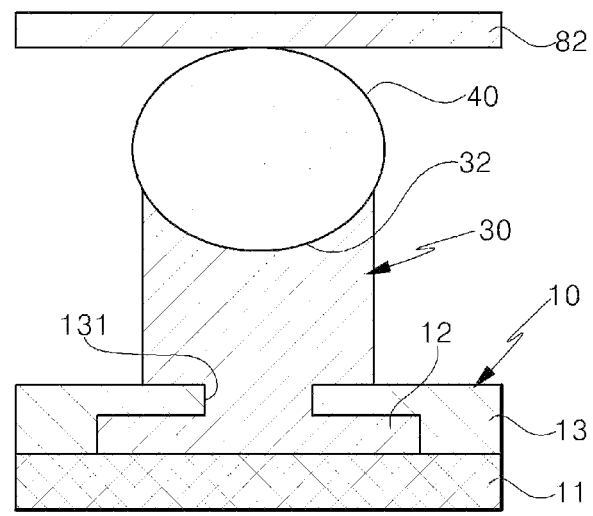
FIG. 3 is a schematic cross-sectional view for explaining an FC POP (Flip Chip Package on Package) structure in which the printed circuit board of FIG. 2 is adopted.
Figure 4A:
FIGS. 4a-4d and 5e-5g are views showing process procedures for a manufacturing method of a printed circuit board according to an embodiment of the present invention.
Figure 4B:
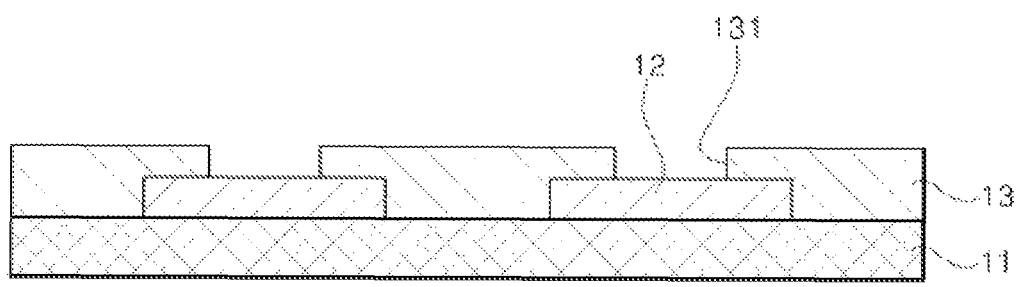
Figure 4C:
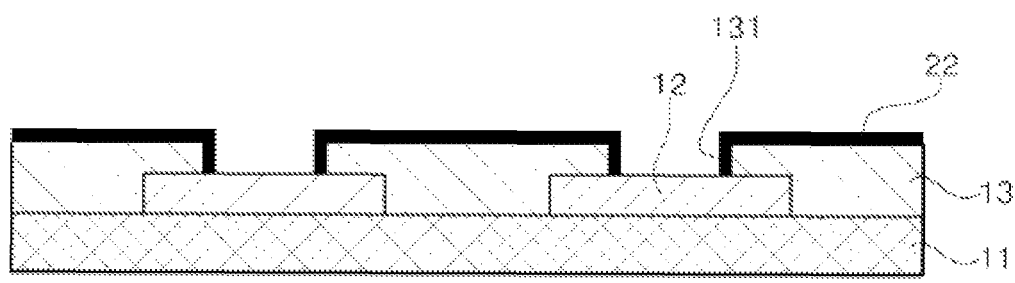
Figure 4D:
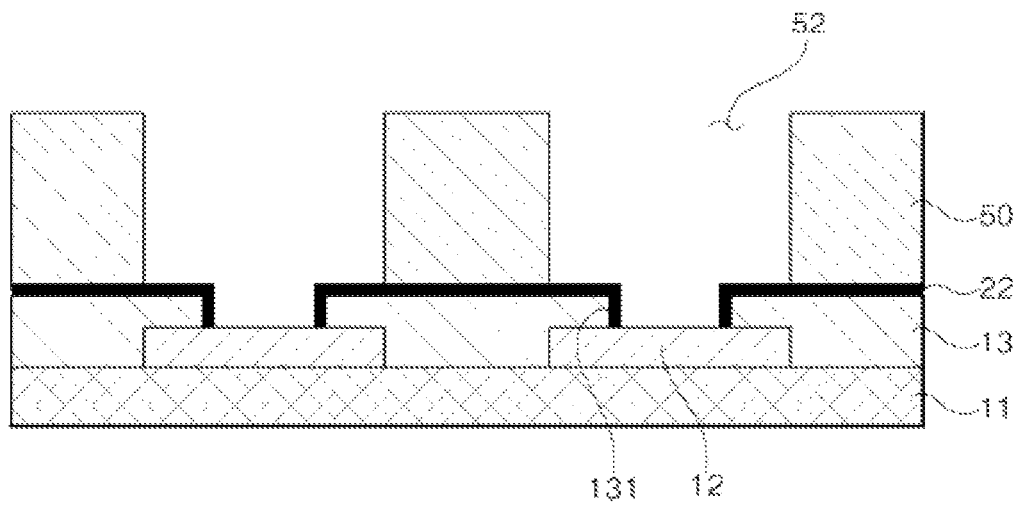

FIG. 3 is a schematic cross-sectional view for explaining an FC POP (Flip Chip Package on Package) structure in which the printed circuit board of FIG. 2 is adopted.

Referring to FIG. 3, the printed circuit board according to the present embodiment is bonded to the second package substrate in a flip chip method. The flip chip bonding is implemented by a bonding structure of two package bumps of the post bump 30 and a solder bump 40 between the printed circuit board and the second package substrate.

In the present embodiment, the solder bump 40 is installed on the concave upper surface 32 of the post bump 30. Thank to such a bonding structure, a bonding property of the post bump 30 and the solder bump 40 is improved so that a package bump having high reliability can be implemented and as a result, a semiconductor package with high reliability can be provided.

The aforesaid second package substrate may be configured to include a bonding pad 82 in contact with the solder bump 40, and the bonding pad 82 may be a conductive pad or an electrode pattern. Furthermore, according to some embodiments, the semiconductor element of the printed circuit board may be fixed via an underfill (see reference numeral 70 of FIG. 8) in a liquid or film form filled in the periphery of the post bump 30.

A method of mounting the second package substrate to the printed circuit board in a flip chip type may be implemented by a process for coating the entire printed circuit board with an underfill material, hardening it in a B-stage state, and then simultaneously performing hardening the underfill and reflowing the solder bump 40.

Figure 5E:
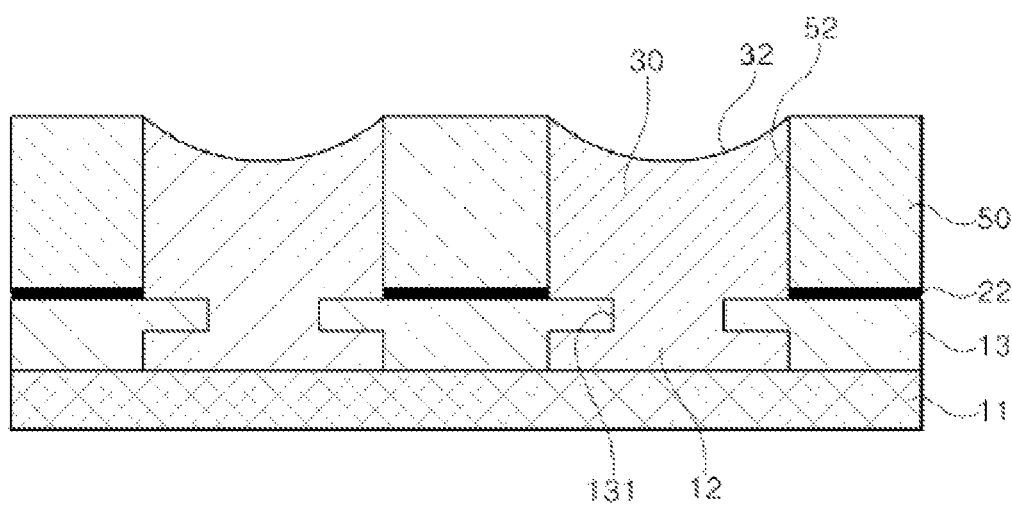

FIGS. 4 and 5 are views showing process procedures for a manufacturing method of a printed circuit board according to an embodiment of the present invention.

In the method of manufacturing the printed circuit board according to the present embodiment, as illustrated in FIG. 4(*a*), the first substrate having a single layer or multi-layered circuit pattern is prepared (hereinafter referred to as "step 1').

Step 1 includes a process for preparing the printed circuit board in which the outer circuit layer 12 is buried by the solder resist 13 on the external insulating layer 11.

A material of the outer circuit layer may include Cu, Ag, Au, Al, Cr, Sn, Pb, Ti, W, Ni, V, P or a combination thereof.

The solder resist 13, which is also called a solder mask, is intended to prevent a solder bridge from occurring when mounting a semiconductor element or a package substrate on the printed circuit board, and refers to an organic film having a heat-resisting property and an insulating property applied to a specific part of the surface of the printed circuit board. The solder resist 13 may have a heat-resisting property capable of enabling thermal stress to endure, mechanical strength, chemoresistance, fire retardant and the like. The solder resist 13 may be formed to be identical to a thickness of the outer circuit layer 12 or to be thicker than the thickness of the outer circuit layer 12.

Next, the post bump connected to the circuit pattern, in particular, the outer circuit layer 12, provided in the first mounting area of the first substrate for mounting the second package substrate and having the concave upper surface is formed (hereinafter referred to as 'Step 2).

The detailed configuration of the second step will be hereinafter described in greater detail.

First, as illustrated in FIG. 4(*b*), the second step includes a process for forming a first opening 131 in the solder resist so as to expose the outer circuit layer 12 (hereinafter referred to as Step 2*a*).

The process for forming the first opening 131 includes a process for forming an opening having a smaller width than a width of the outer circuit layer 11 in one direction so that a lower end portion of the post bump 30 remaining in a form, in which a part of the solder resist 13 is partially inserted into a space between the outer circuit layer 12 and the post burn 30, and in contact with the outer circuit layer 12 can have a bottleneck-like shape.

Next, the second step includes, as illustrated in FIG. 4(*c*), a process for forming an electroless plated layer 22 on the entire first substrate to cover the outer circuit layer 12, the solder resist 13 and the first opening 131 (hereinafter referred to as 'Step 2*b*').

The electroless plated layer 22 may be used as a seed layer when the post bump is formed during an electroplating process. It is preferable that the electroless plated layer 22 be a copper electroless plated layer having ease of formation of the plated layer and a relatively low cost.

Electroless plating refers to a process for forming metal copper by reduction of copper ions resulting from electrons emitted when reducing agents are oxidized from a surface of the outer circuit layer 12 and a surface of the solder resist 13. The electroless plated layer 22 formed by such an electroless plating process is formed in a thin film having a thickness of about 10 nm and has a high step coverage rate in the first opening 131. When the electroless plated layer 22 is used, in an electroplating process, which is a following process, the post bump with zero defects can be easily implemented.

In FIG. 4(*c*), the electroless plated layer 22 may be made of the same material (e.g., copper) as that of the outer circuit layer 12, and for the convenience of illustration, the electroless plated layer on the outer circuit layer 12 is omitted.

Next, Step 2 includes a process (hereinafter referred to as 'Step 2*c*) for forming a dry film resist 50 having a first height to cover the outer circuit layer 12 and the electroless plated layer 22. Step 2*c* may be implemented by compressing a dry film having a thickness of the first height on the electroless plated layer 22 of the first substrate. The first height may be 50 to 400 μm.

Next, step 2 includes, as illustrated in FIG. 4(*d*), a process for forming a second opening 52 in the dry film resist 50 so as to expose the first opening 131 and the electroless plated layer 22 (hereinafter referred to as 'step 2*d*'). The process for forming the second opening 52 may be performed through exposure and development processes.

Next, step 2 includes, as illustrated in FIG. 5(*e*), a process for filling the first opening 131 and the second opening 52 with a conductive material so that the upper surface 32 can be concave while being in contact with the outer circuit layer or the electroless plated layer (hereinafter referred to as 'step 2*e*').

Step 2*e* may be implemented so as to form the post bump having the concave upper surface through electroplating. A concave part of the upper surface of the post bump may have a maximum depth of about 20 μm. The maximum depth of the concave part of the upper surface is determined by surface tension to a plating material of an inner surface of the second opening 52 of the dry film resist.

Electroplating may be implemented by a metallization process in which the electroless plated layer 22 is used as a seed layer. Electroplating is a method of supplying electrons from the outside via the seed layer and forming a metal copper film by reducing of copper ions in a solution using the electrons. In practice, in the method of manufacturing the printed circuit board, a pad (not drawn) for supplying electrons to the electroless plated layer 22 may be provided on one side of the printed circuit board. That is, the pad connected to the electroless plated layer 22 is provided on the printed circuit board, so that electrons can be supplied from an external circuit to the printed circuit board via the pad.

When the post bump 30, which is a copper electroplated layer, is formed using a copper electroless plated layer, by using a fixed metal material, a process can be simplified and costs can be reduced compared to a process for forming the post bump using the other methods, and the post bump with zero defects can be formed through electroplating. When the post bump with zero defects is used, durability of the package bump can be improved.

Also, according to some embodiments, in order to form the post bump with zero defects in the first opening 131 and the second opening 52, to which the seed layer is exposed, in the electroplating process for forming the post bump, an electrolyte solution to which an organic additive is added may be used. In this case, the organic additive is an organic substance which functions to adjust a localized electrostatic coating speed. When the organic additive is used, since the localized electrostatic coating speed can be adjusted, the post bump with zero defects may be easily implemented in the first opening 131 and the second opening 52.

Figure 5F:
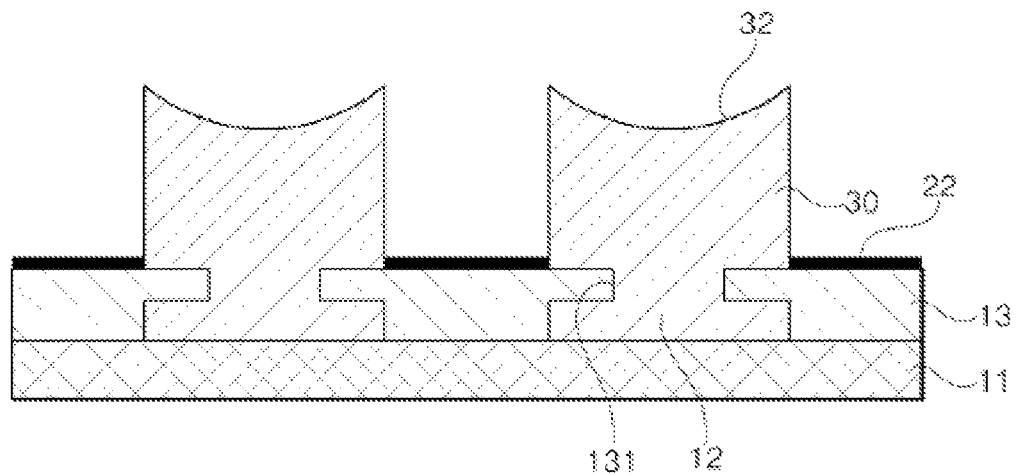

Next, step 2 includes, as illustrated in FIG. 5(f), a process for removing the dry film resist 50 from the electroless plated layer 22 (hereinafter referred to as 'step 2f'). Step 2f may be simply implemented by detaching the dry film resist 50 from the electroless plated layer 22.

Figure 5G:
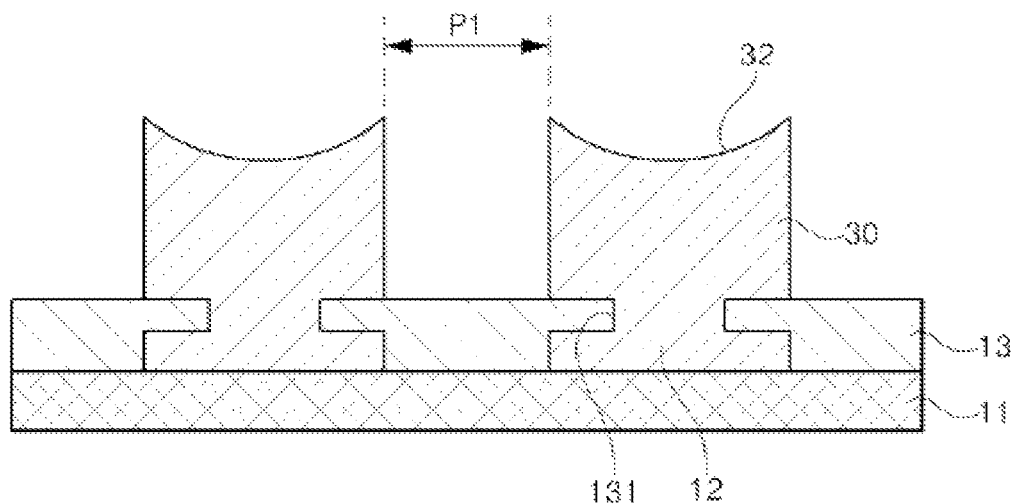

Next, step 2 includes, as illustrated in FIG. 5(g), a process for removing the electroless plated layer 22 (hereinafter referred to as 'step 2g'). Step 2g may be implemented in such a manner as to remove the electroless plated layer 22 through an etching process when the electroless plated layer 22 is exposed to the solder resist 13 through peeling of the dry film resistor 50.

According to the present embodiment, the post bump of the package bump used in the semiconductor package in an FC POP type may be easily implemented as a plating layer with zero defects having a concave upper surface. Also, by using the dry film resist upon implementing the post bump, a pitch P1 between the package bumps may be formed to be small compared to a pitch (see P2 of FIG. 7) between the package bumps of the existing semiconductor package, and accordingly, a semiconductor package useful for high reliability and high density can be provided.

Meanwhile, according to some embodiments, the method of manufacturing the printed circuit board may further include a step of mounting a semiconductor element (see reference numeral 60 of FIG. 8) connected to the circuit pattern after step 1 and step 2 in the second mounting area (see A1 of FIG. 1) intended for mounting the semiconductor element of the first substrate in a flip chip type.

Meanwhile, according to some embodiments, the method of manufacturing the printed circuit board may further include a process for removing smears, burrs or particles from the solder resist before performing a process (step 2b) for forming the electroless plated layer. Such a surface treatment process may be intended to form a surface roughness of the solder resist required in the electroless plating process and may be selectively performed according to the surface roughness of the solder resist.

Figure 6:
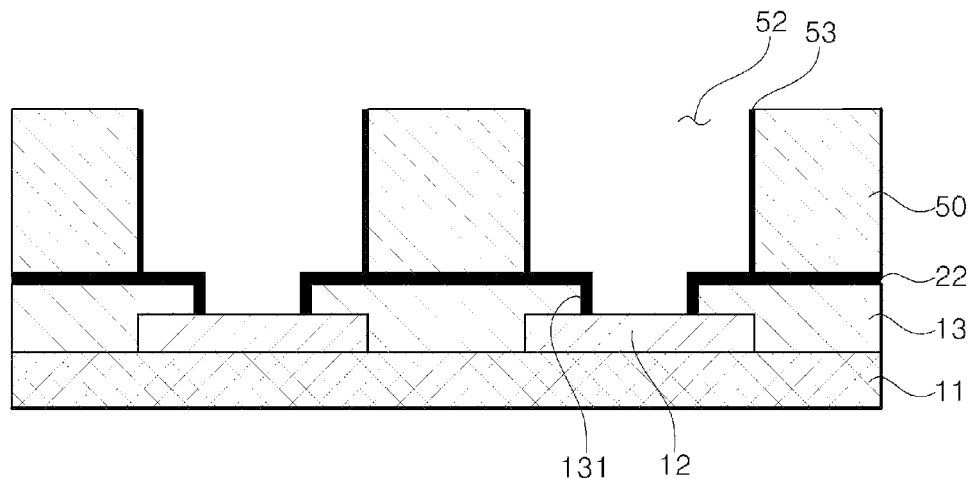
FIG. 6 is a cross-sectional view for explaining main processes of a manufacturing method of a printed circuit board according to another embodiment of the present invention.

FIG. 6 is a cross-sectional view for explaining main processes of a manufacturing method of a printed circuit board according to another embodiment of the present invention.

Referring to FIG. 6, a method of manufacturing the printed circuit board according to the present embodiment may further include a process for surface treatment of the second opening so that surface tension of a conductive material for the second opening can increase, after a process for forming the second opening (step 2d) with regard to a method of manufacturing the printed circuit board of FIGS. 4 and 5.

That is, in the method of manufacturing the printed circuit board according to the present embodiment, a separate surface treatment layer 53 may be formed on the second opening of the dry film resist during the production process.

The surface treatment layer 53 may be formed by performing surface treatment using at least one method of an atmospheric plasma treatment method, a vacuum plasma treatment method, a hydrogen peroxide treatment method, a prooxidant treatment method, and an anticorrosive agent treatment method in order to improve durability and strength upon a conductive material filling process which will be performed later.

According to the surface treatment layer 53, when a conductive material is filled with the second opening 52 in a process which will be performed later, surface tension of the conductive material is increased from an inner surface of the second opening 52 of the dry film resist, and accordingly, an upper surface of the conductive material filled with the second opening 52 has a concave shape.

When the post bump 30 having the concave upper surface is used, the second package substrate (or top package) may be easily bonded to the printed circuit board (or bottom package) in a flip chip type using the solder bump with regard to the package on package process in which the printed circuit board of the embodiments is used. Also, with regard to the bonding structure of the solder bump of the semiconductor package in which the printed circuit board and the second package substrate are bonded, high reliability may be easily implemented.

Meanwhile, in the method of manufacturing the printed circuit board according to the present embodiment, according to some embodiments, in a case where a fixed surface tension is formed from an inner surface of the second opening according to a material of the dry film resist or a process for forming the second opening, such as drying, etching and the like when the second opening is formed in the dry film resist, a separate surface treatment process for forming surface tension of the inner surface of the second opening may be omitted.

Figure 7:
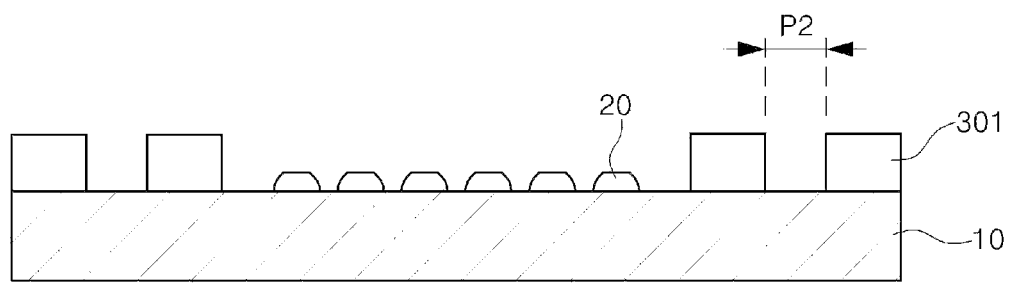
FIG. 7 is a cross-sectional view of a printed circuit board according to an comparative embodiment.

FIG. 7 is a cross-sectional view of a printed circuit board according to a comparative embodiment.

Referring to FIG. 7, the printed circuit board of the comparative example includes: the first substrate 10; the post bump 301 located at a first mounting area of the first substrate 10; and the solder bump 20 located at a second mounting area of the first substrate 10. Here, an upper surface of the post bump 301 has a plan shape.

According to the structure of the post bump 301 of the comparative example, since a bonding surface between the post bump 301 and the solder bump (see reference numeral 40 of FIG. 3) placed on the upper surface of the post bump 301 has a bonding structure (a package bump structure) of a curved surface and a plan surface, a bonding area is relatively very small compared to that of the present embodiment, and thus a bonding property is reduced. Also, in the semiconductor package of this structure, when a filling material such as an underfill and the like is filled with a space between the printed circuit board and the package substrate, there is a high chance that defects will be generated from the package bump structure, and a yield rate of the semiconductor package is reduced.

Figure 8:
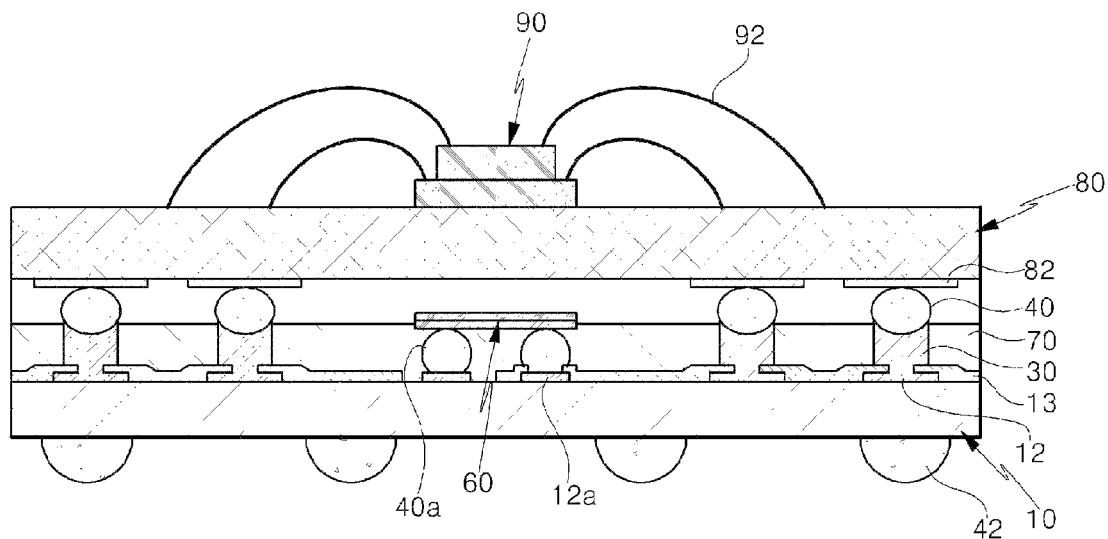
FIG. 8 is schematic cross-sectional view of a semiconductor package according to an embodiment of the present invention.

Also, in the case of the comparative example, in the semiconductor package in a FC POP (Flip Chip Package On Package) type, a bonding area between the printed circuit board and the package substrate connected to an upper part thereof in a flip chip type is relatively small (for example, less than about ½, see a bonding structure of reference numerals 40 and 82 of FIG. 8) compared to that of the present embodiment. Thus, it is problematic in that durability of the semiconductor package or reliability with regard to securing a stable electrical conductive are reduced.

However, in the case of the present embodiment previously explained with reference to FIGS. 1 to 6, since the upper surface of the post bump is formed to be concave, in the bonding structure of the post bump and the solder bump for forming the package bump, the solder bump is disposed to be stably fixed to the upper surface of the post bump and to be partially inserted thereto. Thus, the problems generated from the comparative example can be effectively solved and the semiconductor package with high reliability can be provided.

FIG. 8 is schematic cross-sectional view of a semiconductor package according to an embodiment of the present invention.

Referring to FIG. 8, the semiconductor package according to the present embodiment may include: a first substrate 10; an outer circuit layer 12 of the first mounting area; an outer circuit layer 12a of the second mounting area; a solder resist 13; a package bump of the first mounting area; a solder bump 40a of the second mounting area; a semiconductor element 60; an under fill 70; a second substrate 80; an electrode pattern 82 on the second substrate; a semiconductor element 90 on the second substrate; and a bonding wire 92.

Here, the package bump includes the post bump 30 on the outer circuit layer 12 and the solder bump 40 partially inserted to the concave upper surface of the post bump 30.

In the present embodiment, the first substrate 10, the outer circuit layer 12, 12a, the solder resist 13, the package bump, the solder bump 40a, the semiconductor element 60 and the underfill 70 constitute the printed circuit board or the package substrate (the first package substrate) or a bottom package of an FC POP (Flip Chip Package On Package). The semiconductor element 60 may be a memory chip or a microprocessor chip.

Also, the second substrate 80, the electrode pattern 82, the semiconductor element 90, and the bonding wire 92 constitute the package substrate (the second package substrate) or a top package of the FC POP. The semiconductor element 90 may be a microprocessor chip or a memory chip.

Also, the semiconductor package of the present embodiment may have another solder bump 42 for mounting the semiconductor package to another printed circuit board or another package substrate (a third package substrate) in a flip chip type. The solder bump 42 may be proved on a lower surface of the first substrate 10.

According to the present embodiment, in the semiconductor package, a package bump having high reliability can be implemented, and thus a semiconductor package in an FC POP type with high reliability can be provided.

Meanwhile, in the aforesaid embodiments, even though it has been described that the post bump is formed by an electroplating process in which a copper electroless plated layer is used a seed layer, the present invention should not be limited to such a configuration. The post bump having the concave upper surface may be implemented by using Au as a material of the electroless plated layer and the electroplated layer, Au having the lowest specific resistance (about 1.59 µΩ cm) among metals and high specific resistance to electro migration.

As set forth above, some embodiments of the present invention, it is advantageous in that the printed circuit board and the manufacturing method thereof can improved reliability of a bonding ability between the printed circuit board used in the FC POP (Flip Chip Package on Package) and the like and the package substrate connected to the upper portion of the printed circuit board in a flip chip type.

Some embodiments of the present invention, it is advantageous in that a minute bump pitch can be implemented by a bonding structure between the post bump and the solder bump and bonding reliability can be ensured, thereby providing the semiconductor package in a flip chip structure with high reliability which is useful for mobile devices and the like.

Some embodiments of the present invention, it is advantageous in that a degree in design with regard to a spaced distance between the bottom and top packages can be improved, and reliability of a bonding ability between the solder bump and the package electrode can be improved.

Some embodiments of the present invention, it is advantageous in that bump formation can be easily performed by the flip chip package technology, and the printed circuit board and the manufacturing method thereof and the semiconductor package using the printed circuit board can be provided at low costs with the improvement of bump capacity.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A printed circuit board for a semiconductor package, comprising:
    a first substrate having a first mounting area for mounting a package substrate and a second mounting area for mounting a semiconductor element;
    an uppermost layer of the first substrate;
    an outer circuit layer on the uppermost layer;
    a solder resist on the outer circuit layer and having an opening to expose an upper surface of the outer circuit layer of the first mounting area; and
    a post bump disposed on an uppermost layer of the first mounting area, and connected to an exposed upper surface of the outer circuit layer;
    wherein the post bump comprises:
    a first portion on the outer circuit layer and filled in the opening; and
    a second portion on the first portion and protruding from an upper surface of the solder resist,
    wherein an upper surface of the second portion of the post bump has a concave shape on an inner side of the post bump corresponding to an ellipsoidal shape of a lower portion of a solder bump to be placed on the upper surface of the second portion of the post bump, wherein the second portion of the post bump has a height of 50 to 400 μm, and the upper surface of the second portion has a maximum depth of 20 μm, wherein a radius of the upper surface of the second portion is 20 to 100 μm, wherein the upper surface of the second portion has a curvature of 1 to 0.01 μm$^{-1}$, and wherein a width of the second portion of the post bump is narrower than a diameter of the solder bump.

2. The printed circuit board of claim 1, wherein a part of the solder resist is partially inserted into a space between the outer circuit layer and the post bump.

3. The printed circuit board of claim 2, wherein the outer circuit layer and the post bump are made of different materials.

4. The printed circuit board of claim 1, wherein a material of the post bump includes Cu, Ag, Au, Al, Cr, Sn, Pb, Ti, W, Ni, V, P or a combination thereof.

5. The printed circuit board of claim 1, further comprising an underfill for burying a periphery of the post bump.

6. The printed circuit board of claim 1, further comprising a memory chip or a microprocessor chip connected to the outer circuit layer and mounted in the second mounting area in a flip chip type.

7. A semiconductor package, comprising;
a printed circuit board having a post bump disposed on the printed circuit board;
a solder bump on an upper surface of the post bump; and
a package substrate on the solder bump, the package substrate connected to a circuit pattern of the printed circuit board through the solder bump and the post bump;
wherein the printed circuit board comprises:
an uppermost layer of the printed circuit board;
an outer circuit layer on the uppermost layer;
a solder resist on the uppermost layer and having an opening to expose an upper surface of the outer circuit layer of a first mounting area; and
the post bump disposed on the outer circuit area of the first mounting layer and connected to the upper surface of the outer circuit layer,
wherein the post bump comprises:
a first portion on the outer circuit layer and filled in the opening; and
a second portion on the first portion and protruding from an upper surface of the solder resist,
wherein the second portion of the post bump has a height of 50 to 400 μm, and an upper surface of the second portion has a maximum depth of 20 μm,
wherein the upper surface of the second portion of the post bump has a concave shape on an inner side of the post bump corresponding to an ellipsoidal shape of a lower portion of the solder bump to be placed on the upper surface of the second portion of the post bump,
wherein a radius of the upper surface of the second portion is 20 to 100 μm,
wherein the upper surface of the second portion has a curvature of 1 to 0.01 μm$^{-1}$, and
wherein a width of the second portion of the post bump is narrower than a diameter of the solder bump.

8. The semiconductor package of claim 7, wherein a material of the post bump includes Cu, Ag, Au, Al, Cr, Sn, Pb, Ti, W, Ni, V, P or a combination thereof.

9. The semiconductor package of claim 7, further comprising an underfill for burying a periphery of the post bump.

10. The semiconductor package of claim 7, further comprising a memory chip or a microprocessor chip mounted in a second mounting area of the printed circuit board and connected to a circuit pattern of the printed circuit board in a flip chip type.

* * * * *